United States Patent
Rhoades

(10) Patent No.: US 8,200,686 B2
(45) Date of Patent: Jun. 12, 2012

(54) LOOKUP ENGINE

(75) Inventor: John Rhoades, Bristol (GB)

(73) Assignee: Rambus Inc., Sunnyvale, CA (US)

( * ) Notice: Subject to any disclaimer, the term of this patent is extended or adjusted under 35 U.S.C. 154(b) by 1335 days.

(21) Appl. No.: 11/151,271

(22) Filed: Jun. 14, 2005

(65) Prior Publication Data
US 2005/0243827 A1    Nov. 3, 2005

Related U.S. Application Data

(62) Division of application No. 10/074,022, filed on Feb. 14, 2002, now abandoned.

(30) Foreign Application Priority Data

Feb. 14, 2001 (GB) .................................. 0103678.9
Feb. 14, 2001 (GB) .................................. 0103687.0
Sep. 10, 2001 (GB) .................................. 0121790.0

(51) Int. Cl.
*G06F 17/30* (2006.01)

(52) U.S. Cl. ................................. 707/764; 707/999.006

(58) Field of Classification Search .................. 707/1, 3, 707/6, 10, 707, 764, 999.003, 999.006, 797; 709/238, 240
See application file for complete search history.

(56) References Cited

U.S. PATENT DOCUMENTS

| | | | |
|---|---|---|---|
| 4,628,481 A | 12/1986 | Reddaway | 364/900 |
| 4,755,986 A | 7/1988 | Hirata | 370/60 |
| 4,850,027 A | 7/1989 | Kimmel | 382/49 |
| 4,860,191 A | 8/1989 | Nomura et al. | 364/200 |
| 4,876,641 A | 10/1989 | Cowley | 364/200 |
| 4,899,216 A | 2/1990 | Tatsumi et al. | |
| 4,922,487 A | 5/1990 | Eilenberger et al. | 11/20 |
| 5,021,947 A | 6/1991 | Campbell et al. | 364/200 |
| 5,021,950 A | 6/1991 | Nishikawa | 364/200 |
| 5,121,198 A | 6/1992 | Maronian | |

(Continued)

FOREIGN PATENT DOCUMENTS

EP    0310388 A1    4/1989

(Continued)

OTHER PUBLICATIONS

Combined Search and Examination Report issued on Feb. 24, 2005 in connection with British Application No. GB0500774.5, which is a divisional application of British Application No. GB0103678.9.

(Continued)

*Primary Examiner* — Marc Filipczyk
(74) *Attorney, Agent, or Firm* — Park, Vaughan, Fleming & Dowler LLP

(57) ABSTRACT

A look up engine 200 comprising a storage means 212a, 212b for storing a plurality of entries, each entry comprising a value and an associated key value, such that, in operation, a look up is carried out by outputting a value which is associated with the stored key value which matches an input key value. The look up engine 200 comprises a plurality of look up state machines 206a, 206b, 206c, 206d connected in parallel to enable multiple look ups to be carried out concurrently. Each entry comprises an associated skip value, if the skipped bits of the input key value and the associated skip value mismatches, an error message is output to indicate lookup failure. The entries may be stored in a trie format which is constructed by identifying overlapping ranges between the plurality of entries; splitting the identified overlapping ranges; storing the plurality of entries within a trie structure.

18 Claims, 2 Drawing Sheets

U.S. PATENT DOCUMENTS

| | | | |
|---|---|---|---|
| 5,122,679 A | 6/1992 | Ishii et al. | 307/269 |
| 5,155,484 A | 10/1992 | Chambers, IV | |
| 5,218,709 A | 6/1993 | Fijany et al. | 395/800 |
| 5,224,100 A | 6/1993 | Lee et al. | 370/94.3 |
| 5,325,493 A | 6/1994 | Herrell et al. | 395/375 |
| 5,327,159 A | 7/1994 | Van Aken et al. | |
| 5,371,896 A | 12/1994 | Gove et al. | 395/800 |
| 5,398,262 A | 3/1995 | Ahuja | 375/356 |
| 5,404,550 A | 4/1995 | Horst | 395/800 |
| 5,418,970 A | 5/1995 | Gifford | 395/800 |
| 5,420,858 A | 5/1995 | Marshall et al. | 370/60.1 |
| 5,428,812 A | 6/1995 | Yoshida | 395/800 |
| 5,440,550 A | 8/1995 | Follett | 370/60 |
| 5,463,732 A | 10/1995 | Taylor et al. | 395/163 |
| 5,524,223 A | 6/1996 | Lazaravich et al. | 395/375 |
| 5,603,028 A | 2/1997 | Kitsuregawa et al. | 395/675 |
| 5,612,956 A | 3/1997 | Walker et al. | 370/545 |
| 5,625,836 A | 4/1997 | Barker et al. | 395/800 |
| 5,640,551 A | 6/1997 | Chu et al. | |
| 5,651,099 A | 7/1997 | Konsella | |
| 5,659,781 A | 8/1997 | Larson | 395/800.11 |
| 5,682,480 A | 10/1997 | Nakagawa | 395/200.19 |
| 5,689,677 A | 11/1997 | MacMillan | 395/433 |
| 5,708,836 A | 1/1998 | Wilkinson et al. | 395/800 |
| 5,713,037 A | 1/1998 | Wilkinson et al. | 395/800 |
| 5,717,943 A | 2/1998 | Barker et al. | 395/800 |
| 5,717,944 A | 2/1998 | Wilkinson et al. | 395/800 |
| 5,752,067 A | 5/1998 | Wilkinson et al. | 395/800 |
| 5,754,584 A | 5/1998 | Durrant et al. | |
| 5,754,871 A | 5/1998 | Wilkinson et al. | 395/800 |
| 5,761,523 A | 6/1998 | Wilkinson et al. | 395/800.2 |
| 5,768,275 A | 6/1998 | Lincoln et al. | 370/419 |
| 5,778,241 A | 7/1998 | Bindloss et al. | 395/800 |
| 5,781,549 A | 7/1998 | Dai | 370/398 |
| 5,781,772 A | 7/1998 | Wilkinson, III et al. | |
| 5,822,606 A | 10/1998 | Morton | 395/800.16 |
| 5,822,779 A | 10/1998 | Intrater et al. | 711/168 |
| 5,828,858 A | 10/1998 | Athanas et al. | 710/317 |
| 5,828,870 A | 10/1998 | Gunadisastra | 395/558 |
| 5,872,993 A | 2/1999 | Brown | 395/800.35 |
| 5,918,061 A | 6/1999 | Nikjou | 395/750.06 |
| 5,923,660 A | 7/1999 | Shemla et al. | 370/402 |
| 5,963,746 A | 10/1999 | Barker et al. | 395/800.2 |
| 5,969,559 A | 10/1999 | Schwartz | 327/295 |
| 5,986,913 A | 11/1999 | Childers et al. | 365/51 |
| 6,009,488 A | 12/1999 | Kavipurapu | 710/105 |
| 6,014,659 A * | 1/2000 | Wilkinson et al. | 707/769 |
| 6,035,193 A | 3/2000 | Buhrmann et al. | 455/426 |
| 6,047,304 A | 4/2000 | Ladwig et al. | 708/530 |
| 6,052,592 A | 4/2000 | Schellinger et al. | 455/445 |
| 6,052,769 A | 4/2000 | Huff et al. | 712/3 |
| 6,081,523 A | 6/2000 | Merchant et al. | 370/389 |
| 6,088,355 A | 7/2000 | Mills et al. | 370/392 |
| 6,094,715 A | 7/2000 | Wilkinson et al. | 712/20 |
| 6,101,176 A | 8/2000 | Honkasalo et al. | 370/335 |
| 6,115,802 A | 9/2000 | Tock et al. | 711/216 |
| 6,131,102 A | 10/2000 | Potter | |
| 6,147,996 A | 11/2000 | Laor et al. | 370/394 |
| 6,208,619 B1 | 3/2001 | Takeuchi | 370/229 |
| 6,218,861 B1 | 4/2001 | Sudo et al. | 326/46 |
| 6,219,796 B1 | 4/2001 | Bartley | 713/320 |
| 6,240,524 B1 | 5/2001 | Suzuki | 713/500 |
| 6,301,603 B1 | 10/2001 | Maher et al. | 709/400 |
| 6,305,001 B1 | 10/2001 | Graef | 716/12 |
| 6,366,584 B1 | 4/2002 | Gulliford et al. | 370/403 |
| 6,389,018 B1 | 5/2002 | Clauberg | 370/394 |
| 6,393,026 B1 | 5/2002 | Irwin | 370/401 |
| 6,631,419 B1 * | 10/2003 | Greene | 709/238 |
| 6,631,422 B1 | 10/2003 | Althaus et al. | 709/250 |
| 6,704,794 B1 | 3/2004 | Kejriwal et al. | 709/236 |
| 6,735,219 B1 | 5/2004 | Clauberg | 370/474 |
| 6,831,923 B1 | 12/2004 | Laor et al. | 370/412 |
| 6,832,261 B1 | 12/2004 | Westbrook et al. | 709/236 |
| 6,836,479 B1 | 12/2004 | Sakamoto et al. | 370/389 |
| 6,907,001 B1 | 6/2005 | Nakayama et al. | 370/230 |
| 6,922,716 B2 | 7/2005 | Desai et al. | 708/524 |
| 6,963,572 B1 | 11/2005 | Carr et al. | 370/401 |
| 7,016,367 B1 | 3/2006 | Dyckerhoff et al. | 370/429 |
| 7,290,162 B2 | 10/2007 | Swarbrick et al. | 713/500 |
| 7,317,730 B1 | 1/2008 | Devanagondi et al. | 370/412 |
| 7,349,389 B2 | 3/2008 | Nie | 370/389 |
| 7,382,782 B1 | 6/2008 | Ferguson et al. | 370/395.41 |
| 7,620,050 B2 | 11/2009 | Kawashima et al. | 370/393 |
| 7,656,799 B2 | 2/2010 | Samuels et al. | 370/231 |
| 7,751,402 B2 | 7/2010 | Wolrich et al. | 370/394 |
| 7,782,782 B1 | 8/2010 | Ferguson et al. | 370/235 |
| 2001/0018732 A1 | 8/2001 | Nakagoshi et al. | 712/11 |
| 2002/0003795 A1 | 1/2002 | Oskouy et al. | 370/389 |
| 2002/0075882 A1 | 6/2002 | Donis et al. | 370/412 |
| 2002/0122424 A1 | 9/2002 | Kawarai et al. | 370/394 |
| 2003/0004921 A1 * | 1/2003 | Schroeder | 707/1 |
| 2003/0074388 A1 | 4/2003 | Pham et al. | 709/106 |
| 2003/0093613 A1 * | 5/2003 | Sherman | 707/3 |
| 2003/0140212 A1 | 7/2003 | Stein et al. | 712/22 |
| 2003/0231627 A1 | 12/2003 | John et al. | 370/389 |
| 2004/0017807 A1 | 1/2004 | Dorr et al. | 370/389 |
| 2005/0027793 A1 | 2/2005 | Hass | 709/200 |
| 2005/0243829 A1 | 11/2005 | Spencer | 370/394 |
| 2010/0086233 A1 | 4/2010 | Kitashou | 382/304 |
| 2010/0165991 A1 | 7/2010 | Veal et al. | 370/392 |
| 2010/0325178 A1 | 12/2010 | Won et al. | 707/812 |
| 2011/0013519 A1 | 1/2011 | Chang et al. | 370/241 |

FOREIGN PATENT DOCUMENTS

| | | |
|---|---|---|
| EP | 0570950 A3 | 5/1992 |
| EP | 0570950 A2 | 11/1993 |
| EP | 0735486 | 10/1996 |
| EP | 0 903 660 | 3/1999 |
| EP | 0992895 A1 | 4/2000 |
| EP | 1009167 A2 | 6/2000 |
| GB | 2352536 | 1/2001 |
| GB | 2357601 | 6/2001 |
| GB | 2370381 | 6/2002 |
| GB | 2407673 | 8/2005 |
| GB | 2407674 | 8/2005 |
| JP | 6096035 | 4/1994 |
| JP | 11261641 | 9/1999 |
| JP | 11272629 | 10/1999 |
| JP | 2000261497 | 6/2000 |
| JP | 2001177574 | 6/2001 |
| WO | 92/15960 | 9/1992 |
| WO | 96-14617 | 5/1996 |
| WO | 97/29613 | 8/1997 |
| WO | WO 99/14893 | 3/1999 |
| WO | 00/30322 | 5/2000 |
| WO | 01-31473 | 5/2001 |
| WO | 01/50259 | 7/2001 |

OTHER PUBLICATIONS

Search Report issued in connection with Great Britain Patent Application No. GB 0203632.5 (Claims 27-39 and 41-44) dated Mar. 20, 2003.

Search Report issued in connection with Great Britain Patent Application No. GB 0203632.5 (Claims 22-23) dated Mar. 20, 2003.

Search Report issued in connection with Great Britain Patent Application No. GB 0203632.5 (Claim 40) dated Mar. 20, 2003.

Search Report issued in connection with Great Britain Patent Application No. GB 0203632.5 (Claims 1-12 and 24-26) dated Nov. 5, 2002.

Amendment in response to Office Action mailed Dec. 21, 2009, mail date Sep. 21, 2010, re U.S. Appl. No. 11/752,300, includes Rce. 10 pages.

Notice of Allowance and Fee(s) Due with mail date of Jun. 16, 2010, Includes Notice of References Cited, for U.S. Appl. No. 11/752,299. 7 pages.

Notice of Allowance and Fee(s) Due with mail date of Jul. 26, 2010 for U.S. Appl. No. 10/073,948 (Includes Examiner-Initiated Interview Summary). 19 pages.

Office Action with mail date of Nov. 17, 2004, re U.S. Appl. No. 10/073,948. 18 pages.

Amendment Response to the Office Action of Nov. 17, 2004, with mail date Apr. 18, 2005, re U.S. Appl. No. 10/073,948. 16 pages.

Final Office Action with mail date of Jun. 24, 2005, re U.S. Appl. No. 10/073,948 includes Information Disclosure Statement, 16 pages.

Second Information Disclosure Statement, dated Aug. 23, 2005, re U.S. Appl. No. 10/073,948. 4 pages.
Supplement to Second Information Disclosure Statement, dated Aug. 23, 205, re U.S. Appl. No. 10/073,948. 3 pages.
Amendment Response to the Office Action dated Jun. 24, 2005, with mail date of Oct. 24, 2005, re U.S. Appl. No. 10/073,948. 18 pages.
Office Action with mail date Jan. 9, 2006, re U.S. Appl. No. 10/073,948, includes Information Disclosure Statement and Notice of References cited. 24 pages.
Response to Office Action mailed Jan. 9, 2006, with mail date of Jun. 30, 2006, re U.S. Appl. No. 10/073,948. 13 pages.
Final Office Action with mail date Sep. 13, 2006, re U.S. Appl. No. 10/073,948. 13 Pages.
Amendment dated Jan. 12, 2007, Includes a RCE, re U.S. Appl. No. 10/073,948. 16 pages.
Office Action with mail date Apr. 6, 2007, re U.S. Appl. No. 10/073,948. 7 pages.
Amendment in Response to Restriction Requirement dated Apr. 6, 2007, with mail date of May 6, 2007, re U.S. Appl. No. 10/073,948. 7 pages.
Office Action with mail date Jul. 27, 2007, re Application No. 10/073,948, includes Notice of References Cited. 19 pages.
Response to Non-Final Office Action of Jul. 27, 2007, with mail date of Nov. 23, 2007, re U.S. Appl. No. 10/073,948. 6 pages.
Final Office Action with mail date Feb. 7, 2008, re U.S. Appl. 10/073,948, includes Information Disclosure Statement. 21 pages.
Office Action, Interview Summary conducted Sep. 8, 2008, with mail date of Sep. 15, 2010 in U.S. Appl. No. 10/073,948. 4 pages.
Office Action with mail date Jan. 21, 2009, re U.S. Appl. No. 10/073,948, includes notice of references cited. 43 pages.
Amendment response to nonfinal Office Action dated Jan. 22, 2009, with mail dated of Jun. 25, 2009, re U.S. Appl. No. 10/073,948. 18 pages.
Supplemental Amendment dated Jun. 25, 2009 in U.S. Appl. No. 10/073,948. 8 pages.
Final Office Action with mail date Aug. 11, 2009 for U.S. Appl. No. 10/073,948. 44 pages.
Notice of Appeal from the Examiner to the Board of Patent Appeals and Interferences filed on Feb. 14, 2002, mail date Feb. 11, 2010 re U.S. Appl. No. 10/073,948. 2 pages.
Office Action, Interview Summary, with mail date of Feb. 4, 2010 in U.S. Appl. No. 10/073,948. 4 pages.
Amendment Response to Final Office Action mailed Aug. 11, 2009, mail date of May 11, 2010 for U.S. Appl. No. 10/073,948. 12 pages.
Comments on Statement of Reasons for Allowance, dated Oct. 26, 2010 in U.S. Appl. No. 10/073,948. 2 pages.
Preliminary Amendment with mail date May 23, 2007, re US Application No. Unassigned (Divisional of U.S. App. No. 10/073,948). 5 pages.
Office Action with mail date Nov. 31, 2008 re U.S. Appl. No. 11/752,299, includes Notice of References Cited. 15 pages.
Amendment Response dated Mar. 31, 2009 to the Final Office Action mailed Dec. 31, 2008 re U.S. Appl. No. 11/752,299. 7 pages.
Final Office Action with mail date Jul. 9, 2009 for U.S. Appl. No. 11/752,299 includes Information Disclosure Statement. 18 pages.
Response dated Dec. 9, 2009 to the Final Office Action mailed Jul. 9, 2009 includes Declaration re U.S. Appl. No. 11/752,299. 12 pages.
Asanovic, et al.,"SPERT: A VLIW/SIMD Microprocessor for Artificial Neural Network Computations". IEEE, 0/8186-2967-3/92 (c), Mar. 1992, pp. 178-190. 13 pages.
ISSC95 (Evening discussion Session). Large-Scale Integration versus Multi-Chip Modules; This paper appears in: Solid State Circuits Conference, 1995. Digest of Technical Papers. 42nd ISSCC, 1995 IEEE International; Publication Date: Feb. 15-17, 1995.
Ganjali, et al.; "Input Queued Switches: Cell Switching vs. Packet Switching," IEEE, 0-7803-7753-2/03, Feb. 2003, pp. 1651-1658. 8 pages.
Office Action with mail date of Apr. 27, 2009 re U.S. Appl. No. 11/752,300, includes Notice of References Cited and Informaiton Disclosure Statement. 39 pages.
Amendment Response to Office Action issued Apr. 27, 2009, with mail date of Oct. 26, 2009, re US U.S. Appl. No. 11/752,300, includes Declaration and Terminal Disclaimer. 20 pages.

Office Action, Interview Summary conducted Oct. 22, 2009, with mail date of Oct. 28, 2009, in U.S. Appl. No. 11/752,300. 4 pages.
Final Office Action with mail date of Dec. 21, 2009, in U.S. Appl. No. 11/752,300. 45 pages.
Office Action, Interview Summary conducted Sep. 9, 2010, with mail date of Sep. 14, 2010, in U.S. Appl. No. 11/752,300, with Notice of Appeal from the Examiner. 6 pages.
Comments dated Oct. 26, 2010 on statement of Reasons for Allowance re U.S. U.S. Appl. No. 10/073,948. 2 Pages.
Marsan et al.: "Router Architectures Exploiting Input-Queued, Cell-Based Switching Fabrics", Aug. 17, 2000. 19 pages.
Notice of Allowance and Fee(s) Due with mail date of Nov. 19, 2010 re U.S. U.S. Appl. No. 11/752,300 includes Notices of References Cited. 43 Pages.
Rai et al. (Packet Processing on a Simd Stream Processor); Network Processor, vol. 3: Issues and Practices, vol. 3 (the Morgan Kaufmann Series in Computer Architecture and Design), dated Feb. 15, 2005. 26 pages.
Seshadri et al. (A Case for Vector Network Processors); Proceedings of the Network Processors Conference West, Oct. 2002, 19 pages.
Wolf et al. (Design Issues for High-Performance Active Routers); This paper appears in: Selected Areas in Communications, IEEE Journal on; Issue Date: Mar 2001, vol. 19 Issue 3, pp. 404-409. 6 pages.
Comments on statement of Reasons for Allowance dated Feb. 16, 2011 re U.S. Appl. No. 11/752,300. 2 pages
GB Search Report, dated Aug. 12, 2002, with mail date of Aug. 13, 2002, re GB Application No: 0203634.1. 3 pages.
Office Action with mail date of Dec. 10, 2004, re U.S. Appl. No. 10/074,022. 4 pages.
Response to Restriction Requirement with mail date of Jan. 10, 2005, re U.S. Appl. No. 10/074,022. 8 pages.
Office Action with mail date Apr. 7, 2005, re U.S. Appl. 10/074,022, includes Notice of Reference Cited and Information Disclosure Statement. 11 pages.
Second Information Disclosure Statement with mail date of May 20, 2005, re U.S. Appl. No. 10/074,022. 4 pages.
Amendment in response to Office Action of Apr. 7, 2005, with mail date of Apr. 4, 2005, re U.S. Appl. No. 10/074,022. 16 pages.
Final Office Action with mail date of Sep. 16, 2005, re Application no. 10/074,022, includes Information Disclosure Statement. 10 pages.
Amendment response to Office Action mailed Sep. 16, 2005, with mail date of Sep. 16, 2005, re U.S. Appl. No. 10/074,022. 8 pages.
Office Action with mail date of Apr. 27, 2006, re U.S. Appl. No. 10/074,022. 8 pages.
Amendment response to Office Action mailed Apr. 27, 2006, with mail date of Jul. 26, 2006, re U.S. Appl. No. 10/074,022. 11 pages.
Final Office Action with mail date of Sep. 26, 2006, re U.S. Appl. No. 10/074,022. 9 pages.
Amendment response to Office Action mailed Sep. 26, 2006, with mail date of Mar. 18, 2007, re U.S. Appl. No. 10/074,022. 11 pages.
Office Action with mail date of Jun. 15, 2007, re U.S. Appl. No. 10/074,022, includes Notice of References Cited. 13 pages.
Amendment response to Office Action mailed Jun. 15, 2007, with mail date of Nov. 15, 2007, re U.S. Appl. No. 10/074,022. 17 pages.
Third Information Disclosure Statement with mail date Nov. 19, 2007, re U.S. Appl. No. 10/074,022. 3 pages.
Microsoft Computer Dictionary, 5th ed., 2002, p. 406, Redmond, Washington, USA. 3 Pages.
Final Office Action with mail date Jan. 30, 2008, re U.S. Appl. No. 10/074,022, includes Information Disclosure Statement. 14 pages.
International Search Report with mail date of Aug. 27, 2002, re Int'l Application No. PCT/GB02/00662, includes Notification of Transmittal. 6 pages.
Written Opinion with mail date of Feb. 13, 2003, re Int'l Application No. PCT/GB02/00662. 6 Pages.
International Preliminary Examination Report with mail date of Feb. 13, 2003, re Int'l Application No. PCT/GB02/00662, with Notification of Transmittal. 12 pages.
GB Combined Search and Examination Report dated Feb. 24, 2005, re Int'l Application GB 0500780.2. 4 pages.
GB Response to Combined Search and Examination Reports dated Feb. 24, 2005, re UK Application GB 0500774.5. 10 pages.

GB Response to the Office Action dated Feb. 24, 2005, with mail date of Jun. 14, 2005, re UK Application No. GB 0500780.2. 6 pages.
GB Search Report under Section 17(5) with mail date of Aug. 9, 2002; re GB 0203633.3. 2 pages.
GB Examination Report under Section 18(3) with mail date of Jul. 22, 2004; re GB 0203633.3. 2 Pages.
GB Response to Examination Report dated Jul. 22, 2004, with mail date of Jan. 24, 2005; re GB 0203633.3. 8 pages.
GB Search Reports with mail date of May 9, 2003, re GB Application No: 0203634.1. 7 pages.
GB Examination Report under Section 18(3) with mail date of Sep. 3, 2004, re GB Application No: 0203634.1. 4 pages.
GB Response to Examination Report dated Sep. 3, 2005 [should be 2004], with mail date of Mar. 31, 2005, re GB Application No: 0203634.1. 11 pages.
GB Examination Report under Section 18(3) with mail date of Jun. 15, 2004, re GB Application No: 0203632.5. 2 pages.
GB Response to Examination Report dated Jun. 15, 2004, with mail date of Dec. 8, 2004, re GB Application No: 0203632.5. 5 pages.
GB Examination Report under Section 18(3) with mail date of Feb. 24, 2005, re GB Application No: 0203632.5. 1 page.
GB Response to Examination Report dated Feb. 24, 2005, with mail date of Apr. 18, 2005, re GB Application No: 0203632.5. 3 pages.
GB Response to first Written Opinion dated May 21, 2003 with mail date of Jun. 11, 2003, re GB 0319801.7. 3 pages.
GB Examination Report under Section 18(3) with mail date of Jul. 28, 2004, re GB 0319801.7. 2 Pages.
GB Response to Examination Report dated Jul. 28, 2004 with mail date of Mar. 23, 2005, re GB 0319801.7. 5 pages.
GB Examination Report under Section 18(3) with mail date of Jan. 21, 2004, re GB 0321186.9. 2 Pages.
GB Response to official letter dated Jan. 21, 2004 with mail date of Aug. 23, 2004, re GB 0321186.9. 6 Pages.
GB Examination Report under Section 18(3) with mail date of Sep. 21, 2004, re GB 0321186.9. 1 Page.
GB Response to official letter dated Sep. 21, 2004 with mail date of Jan. 19, 2005, re GB 0321186.9. 6 pages.
Response dated Apr. 20, 2011 to the Office Action and Substance of the Interview dated Jan. 7, 2011. 9 Pages.
CN First Office Action dated Aug. 12, 2005, re CN Application No. 02808124.2. 11 Pages.
CN Second Office Action dated Jun. 16, 2006, re CN Application No. 02808124.2. 6 pages.
CN Response to Second Office Action dated Jun. 16, 2006, wing submission date of Aug. 16, 2006, re CN Application No. 02808124.2. 7 pages.
CN Response to Third Office Action dated Feb. 16, 2007, with mail date of Jun. 20, 2007, re CN Application No. 02808124.2. 15 pages.
GB Search Report dated May 23, 2005, in connection with GB Patent Application No. GB0506813.5. 3 pages.
GB Search Report dated May 23, 2005, in connection with GB Patent Application No. GB0506818.4. 3 pages.
Amendment in Response to Office Action dated Jun. 15, 2007, with mail date of Nov. 15, 2007, re U.S. Appl. No. 10/468,167. 9 pages.
Final Office Action with mail date of Feb. 4, 2008, re U.S. Appl. No. 10/468,167. 10 pages.
Dally et al., "Route Packets, Not Wires: On-Chip Interconnection Networks," Design Automation Conference, 2001, Las Vegas, Nevada, Jun. 18-22, 2001. 6 pages.
Bellaouar, A., et al., "Low-Power Digital VLSI Design: Circuits and Systems," Springer 1995, pp. 505-506. 3 pages.
Office Action dated Jun. 6, 2011 re U.S. Appl. No. 12/965,673 includes Notice of References Cited. 30 Pages.

* cited by examiner

LOOKUP ENGINE

This application is a divisional of U.S. application Ser. No. 10/074,022, filed Feb. 14, 2002, now abandoned, which claims priority under 35 U.S.C. §§119 and/or 365 to 0103678.9 filed in the United Kingdom on Feb. 14, 2001; 0103687.0 filed in the United Kingdom on Feb. 14, 2001; and 0121790.0 filed in the United Kingdom on Sep. 10, 2001, the entire content of which is hereby incorporated by reference.

TECHNICAL FIELD

The present invention relates to a look up engine for use in computer systems. In particular, but not exclusively, it relates to look-up engine for use in routing tables, flow tables and access control lists.

BACKGROUND OF THE INVENTION

One area in which look up tables are extensively used are in routing tables for use by a router. A router is a switching device which receives a packet, and based on destination information contained within the data packet, routes the packet to its destination.

Each packet contains a header field and data field. The header field contains control information associated with the routing of the packet including source and destination information. On receiving a packet, a router identifies the key in the header field. The key contains the information that is used to look up the route for the received packet.

The look up table includes a plurality of entries having a route destination associated with a "key". After a key for a packet has been determined, the router performs the look-up in the look up table for the matching entry and hence the destination associated with the key and routes the packet accordingly. A given key may typically match a large number of routes in the look up table.

Traditional routing processes using a conventional look up table are very time consuming. One known method to speed up this look up process is to cache the most recent or often performed matches.

Furthermore it is difficult to update conventional look up tables to change routing information.

One solution to this is to provide a look up table in which the entries are stored in a special format, known as a "trie". A trie is a multi-way tree structure used for organising data to optimise lookup performance. The data is organized as a set of linked nodes, in a tree structure. Each trie node contains a power-of-two number of entries. Each entry is either empty or contains the lookup result. If the entry is empty, it will point to another trie node and the look up process is repeated. If the entry contains the look up value, this value is returned and the look up process is effectively terminated.

A particular form of such a trie is a level-compressed trie (LC-trie) data structure also known as a "Patricia" tree (Practical Alogorithm to Retrieve Information Coded In Alphanumeric).

A traditional trie uses every part (bit or characters) of the key. in turn, to determine which subtree to select. However, a Patricia tree nominates (by storing its position in the node) which element of the key will next be used to determine the branching. This removes the need for any nodes with just one descendent and consequently the Patricia tree utilises less memory than that required by a traditional trie. However, Patricia trees are fairly expensive to generate, so a table which utilises such a format is best used in applications for which lookup speed is more important than update speed. However, with increasing complexity of routers and hence the increased size of such look tables, it has become increasingly important to increase the speed of look up and the accuracy of lookup.

SUMMARY OF THE INVENTION

The object of the present invention is to provide a look up engine and look up process which provides fast and accurate look up.

This is achieved in accordance with a first aspect of the present invention by providing a look up table comprising a plurality of parallel look up state machine which can provide concurrent look ups. Each look up state machine accesses storage means, preferably comprising a plurality of parallel, independent memory banks, in which the look up table may be constructed on the basis of a trie, more preferably a Patricia tree structure. Such a look up table provides increased performance by doing multiple parallel lookups to multiple memory banks in parallel. The returned value may be a final value or reference to another table.

The object of the invention is also achieved in accordance with a second aspect of the present invention by providing each trie entry with a skip value field. This enables the ability to avoid false hits, avoiding a memory access to check if a table hit is real. Conventional tries return false hits. During the lookup process, the skip value field is compared to the skipped key bits, and a lookup failure is signalled if they do not match. In the traditional implementation of LC-tries, skip values are not stored in the trie entries, which gives rise to false hits in the table. The possibility of false hits means that hits have to be confirmed by performing an additional memory reference to the full table. The provision of a skip value field for each entry eliminates the need for this extra memory reference, at the expense of somewhat larger entries. The look up engine in accordance with the first aspect may incorporate the feature of the second aspect. If the feature of the second aspect is not incorporated, then it can be appreciated that the false hits may be returned but the memory required for the look up table or tables would be reduced. Further, it can be appreciated that further processing would be required to detect such false hits.

Key lengths, for example, can be up to 128 bits and values can be up to 41 bits. The table lookup engine has some internal memory for table storage, and it can also use memory external to the table lookup engine block.

The object of the invention is also achieved in accordance with a third aspect of the present invention by providing a table lookup engine which deals with longest prefix matching by pre-processing the entries to split overlapping ranges. The conventional method is to maintain a "history stack" in the trie hardware for this. In pre-processing the entries in this way, the hardware is simplified.

In the event of multiple tables which may be used for different protocols, then these could be stored as separate tables and which table to be search is chosen by the value of the input key. Alternatively, the tables may be combined in the same tree so the first look up (and therefore the first bits of the input key value) is which way to branch to get at the appropriate sub-table.

Multiple logical tables can be supported simultaneously by prep ending the keys with a table selector.

The table lookup engine according to the present invention is capable of returning the number of bits that did match in the case of a table miss.

Parallel lookups can be further accelerated by pre-processing the tables, such that lookups that require more memory accesses have their entries preferentially placed in fast, on-chip RAM.

Further, in accordance with a preferred embodiment, the lookup table or tables is constructed in software giving a high degree of flexibility, for example, the length of the key value can be fixed or of variable length, the tree depth is programmable and the size of the tree and performance can be optimised. It is simply to design the look up with or without the facility of minimising false hits. Of course, it can be appreciated that a table which has false hits would be smaller in size, but would require further processing of the result to detect false hits. The software utilised by the present invention pre-processes the data into the trie structure which enables different performance trade-offs and types of lookups/return values possible with the same simple hardware.

DETAILED DESCRIPTION OF PREFERRED EMBODIMENTS

Figure 1:
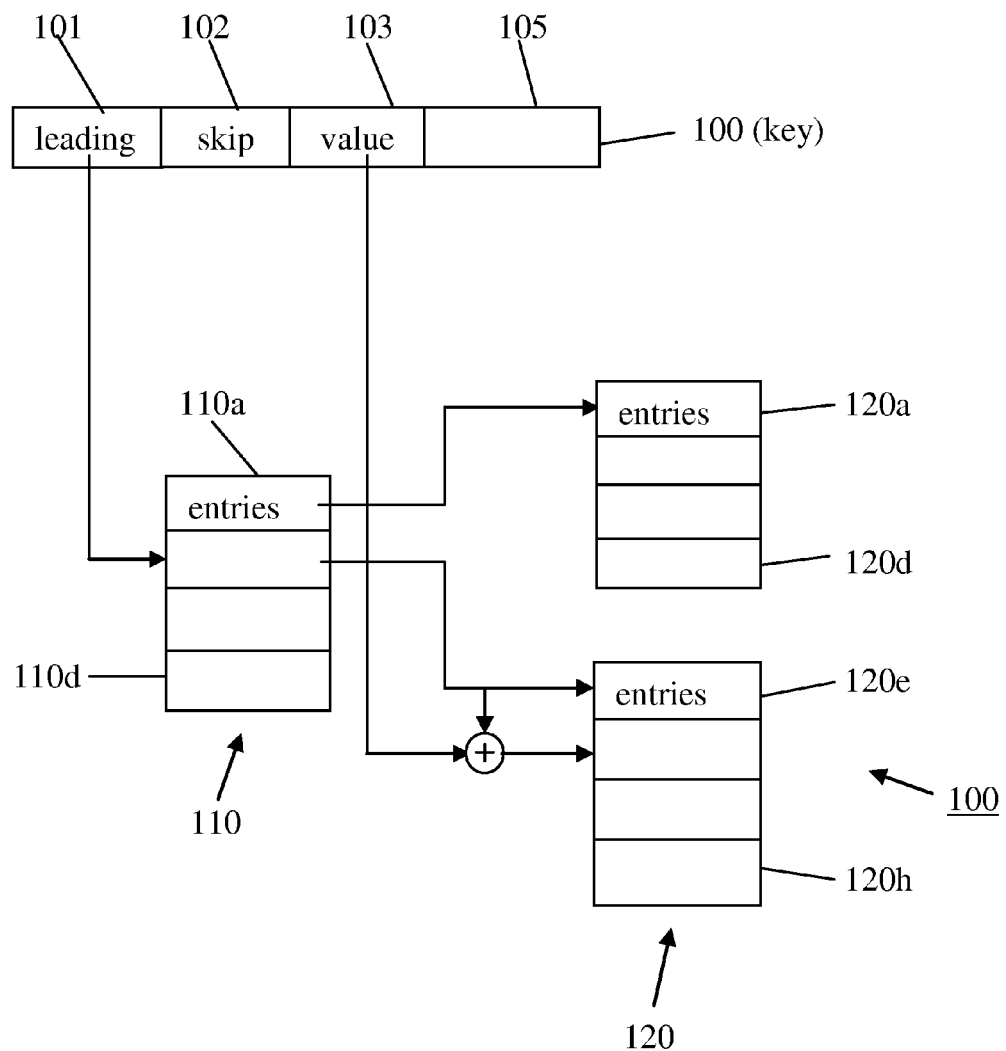
FIG. 1 is a schematic block diagram of the LC-trie data structure of the look up table according to an embodiment of the present invention.

With reference to FIG. 1, the trie structure of a look up table according to an embodiment of the present invention will be described. The look up table comprises a plurality of entries 110a-110d, 120a-120h. Each entry comprises a look up value and an associated key value. The entries are arranged within the look up table in a plurality of hierarchal nodes, for example a first level 110 and a second level 120. Although only two levels are illustrated here, it can be appreciated that any number of levels may be supported.

A key 100 is input into the look up table. A predetermined number of the leading bits of the input key 100 are used to index into the first level 110 of the hierarchy of nodes. This is done by adding the value of these bits to the base address of the node. In the example shown in FIG. 1, the leading bits 101 of the input key 100 point to an entry 110b of the first level of nodes 110. The entry 110b contains a skip count and a skip value. The skip count causes the look up process to skip a predetermined number of bits 102 in the input key 100. The skip value indicates the number of bits 103 to be used to index into the next level 120 of nodes. As in the previous level the look up is carried out by adding the value of these bits 103 to the base address of the node 120. This points to a particular entry 120f. This entry 120f contains the final value. The value is returned and the look up process is terminated.

In this example, two memory accesses were used to do the lookup, one in trie level 110 and the other in trie level 120. In practice, real tables contain many more nodes and levels than shown in this example. For instance, a typical forwarding table, in accordance with a preferred embodiment of the present invention, with 100,000 entries might contain 6 levels and 200,000 nodes.

In the preferred embodiment, the size of each entry within the nodes is fixed at 8 bytes and is independent of the size of the key. This enables the internal memory width to be set to 8 bytes so that it is useful as ordinary memory when used in a bypass mode. A typical format of a node entry may be as shown in Table I.

TABLE I

| field | bits | usage |
| --- | --- | --- |
| bcnt | 4 | number of key bits used to index next node |
| scnt | 4 | number of key bits to skip |
| sbits | 15 | value to check against key when skipping |
| bindx | 22 | location of next node |

If, for example, all the bits of bcnt is set to one, the remaining bits in the entry represent a value (either an actual value or the special value for lookup failure). This means that values can contain up to 60 bits. It also means that $1<=bcnt<=14$, so the maximum node size is $2^{14}$ entries. If any one of the bits of bcnt is not set to one, the entry represents a pointer to another node.

The depth of a trie depends primarily on the number of entries in the table and the distribution of the keys. For a given table size, if the keys tend to vary mostly in their most significant bits, the depth of the trie will be smaller than if they tend to vary mostly in their least significant bits. A branch of the trie terminates in a value entry when the bits that were used to reach that entry determine a unique key. That is to say, when there does not exist two different keys with the same leading bits.

The nodes of a trie can contain many empty entries. Empty entries occur when not all possible values of the bit field used to index a node exist in the keys that are associated with that node. For such routing tables about half the nodes are empty. Since, in the preferred embodiment, the size of a node entry is 8 bytes, such tables will consume about 16 bytes of memory per table entry.

Each trie entry in the look up table, according to the embodiment of the present invention, includes a skip value field. During the lookup process, the skip value field is compared to the skipped key bits, and a lookup failure is signalled if they do not match.

The table lookup engine comprises at least one interface unit. The interface unit comprises an initiator and target interfaces to connect to a bus system of a processing system. The initiator comprises a control and status interface for initialization, configuration and statistics collection, which is in the peripheral virtual component interface (PVCI) address space. There is a lookup interface for receiving keys and sending results of lookups, which is in the advanced virtual component interface (AVCI) address space. There is a third memory interface that makes the internal memory of the table lookup engine available as ordinary memory, which is in the AVCI address space. All these interface units can be used concurrently. It is possible to make use of the memory interface while the table lookup engine is busy doing lookups. Indeed, this is how the tables in the table lookup engine are updated without disrupting lookups in progress. The table lookup engine can be configured to use external (to the block) memory which can be accessed by the bus, in addition to or instead of its internal memory.

There are several internal registers that can be read or written. The control interface provides the following functions. Note that the key and value sizes are not configurable via this interface. The application that generates the tables determines how many key bits will actually be used. In the preferred embodiment, the processing system supports key sizes of 32, 64 or 128 bits, but internally the table lookup engine expands shorter keys to 128 bits, by appending extra lower-significance bits. The table lookup engine always returns 64 bit values, but it is up to the application how many of these bits to use.

TABLE II

| Field | Bits | Reset Value | Function |
|---|---|---|---|
| Reset | 0 | 0 | When set (reset = 1), perform a complete reset of the table lookup engine blocks |
| Enable | 1 | 0 | When set (Enable = 1), enable the table lookup engine |
| CountersOn | 2 | 0 | When set (CountersOn = 1), enable updating of the counters |

TABLE III

| Field | Bits | Reset Value | Function |
|---|---|---|---|
| ResetStatus | 0 | 0 | Indicates whether the table lookup engine is busy resetting or not |
| EnableStatus | 1 | 0 | Indicates the enable state of the table lookup engine |
| CountersOnStatus | 2 | 0 | Indicates whether updating the counters mode is enabled |

TABLE IV

| Field | Bits | Reset Value | Function |
|---|---|---|---|
| IntMemoryStart | 31:0 | note | Start location of internal memory in bytes |
| IntMemorySize | 31:0 | note | Size of internal memory in bytes |

Note: After reset, these registers contain the start and size of the entire internal memory. The application can change these if it wishes to reserve some portion of the memory for non-table lookup engine purposes.

TABLE V

| Field | Bits | Reset Value | Function |
|---|---|---|---|
| ExtMemoryStart | 31:0 | 0 | Start location of internal memory in bytes |
| ExtMemorySize | 31:0 | 0 | Size of internal memory in bytes |

TABLE VI

| Field | Bits | Reset Value | Function |
|---|---|---|---|
| NumLookups | 31:0 | 0 | Number of lookups |
| NumIntMem-Reads | 31:0 | 0 | Number of internal memory reads |
| NumExtMem-Reads | 31:0 | 0 | Number of external memory reads |
| NumIntBank-ReadsN | 31:0 | 0 | Number of reads by internal memory bank (N registers, where N is number of banks) |
| NumExtBank-ReadsN | 31:0 | 0 | Number of reads by external memory bank (M registers, where M is number of banks) |

The table lookup engine internal memory according to the embodiment of the present invention is organised as two equal size, independent banks. The size of these banks is a synthesis parameter. They are organised as a configurable number of entries with a width of 8 bytes. The maximum number of entries that can be configured for a bank is 131072, which implies a maximum total memory size of 2 megabytes. Clients can use the table lookup engine internal memory in the same way as ordinary memory, bypassing the lookup state machines. The address for a memory access selects one or more entries (depending on the details of the bus transaction) for reading or writing.

The protocol for a lookup is an AVCI write transaction to address TLEKeyAddr. Multiple keys can be submitted for lookup in a single write transaction. The table lookup engine responds by sending back an AVCI read response to the source interface containing the values.

The table lookup engine has a key input FIFO with at least 128 slots, so it can accept at least that many keys without blocking the bus.

Lookups that succeed return the value stored in the table. Lookups that fail (the key is not in the table) return a special "missing value" containing a bit pattern specified by the user. It is feasible to construct the tables in such a way that a lookup failure returns additional information, for example, the number of bits of the key that do match in the table. This assists the processing system in evaluating the cause of the failure.

The table lookup engine does not internally support longest prefix matching, but that effect can still be achieved by constructing the tables in the proper way. The idea is to split the overlapping address ranges into disjoint pieces.

Lookup values may not necessarily be returned in the order of the keys. The transaction tagging mechanism of AVCI is used to assist client blocks in coping with ordering changes.

Multiple client blocks can submit lookup requests simultaneously. If this causes the input FIFO to fill up, the bus lane between the requestor block and the table lookup engine will block temporarily. The table lookup engine keeps track internally of the source port of the requester for each lookup, so the result values will be sent to the correct place. This may return the result to the requester or elsewhere.

The contents of the memory being used by the table lookup engine can be updated while lookups are in progress. The actual updates are done via the memory interface. A software protocol is adopted to guarantee table consistency.

Figure 2:
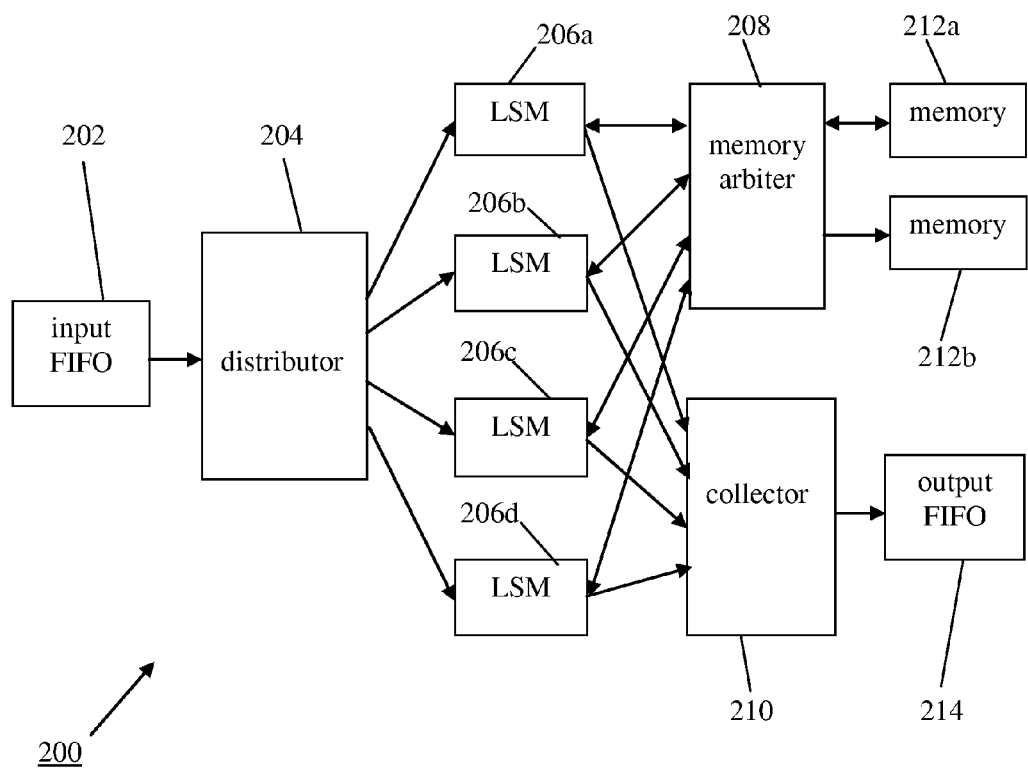
FIG. 2 is a schematic block diagram of the table look up engine according to the embodiment of the present invention.

The table lookup engine 200, as shown in FIG. 2, comprises an input FIFE buffer 202 connected to the input of a distributor 204. the output of the distributor is connected in parallel to a plurality of lookup state machines 206a, 206b, 206c, 206d. Each lookup state machine 206a, 206b, 206c, 206d has access to a storage means. The storage means comprises a memory arbiter 208 and a plurality of parallel independent memory banks 212a, 212b. Each lookup state machine 206a, 206b, 206c, 206d is connected to the input of a collector 210. The output of the collector 210 is connected to an output FIFO buffer 214.

The table lookup engine uses a number of lookup state machines (LSM) 206a, 206b, 206c, 206d operating concurrently to perform lookups. Incoming keys from the bus are held in an input FIFO 202. These are distributed to the lookup state machines 206a, 206b, 206c, 206d by a distributor block 204. Values coming from the state machines are merged by a collector block 210 and fed to an output FIFO 214. From here the values are sent out on the bus to the requester.

The entries of the input FIFO 202 each contain a key, a tag and a source port identifier. This FIFO 202 has at least 128 slots, so two clients can each send 64 keys concurrently without blocking the bus lane. Even if the FIFO 202 fills, the bus will only block momentarily.

The distributor block 204 watches the lookup state machines 206a, 206b, 206c, 206d and sends a key to any one that is available to do a new lookup. A priority encoder may be used to choose the first ready state machine.

The lookup state machines 206a, 206b, 206c, 206d do the lookup using a fixed algorithm. They treat all keys as 128 bits and all values as 60 bits internally. These sizes were chosen somewhat arbitrarily. It would be possible to extend the maximum key size to 256 bits. The main impact on the table lookup engine would be an increase in the size of the input FIFO 202 and LSMs 206a, 206b, 206c, 206d. It would be possible to increase the maximum size of the result. The main impact would be that trie entries would be larger than 8 bytes, increasing the overall table lookup engine memory required for a given size table. Shorter keys are easily extended by adding zero-valued least significant bits. Memory read requests are sent to the memory arbiter block 208. The number of memory requests needed to satisfy a given lookup is variable, which is why the table lookup engine may return out-of-order results.

The collector block 210 serialises values from the lookup state machines 206a, 206b, 206c, 206d into the output FIFO 214. A priority encoder may be used to take the first available value.

The memory arbiter block 208 forwards memory read requests from the state machines 206a, 206b, 206c, 206d to the appropriate memory block 212a, 212b. This might be to an internal memory bank or an external memory accessed via the bus. The table lookup engine has an initiator block for performing external memory reads. If the block using the table lookup engine and the external memory are on the same side of the table lookup engine, there will be bus contention. Avoiding this requires a bus layout constraint: the table lookup engine must sit between the main processing units and the external memory, and the table lookup engine initiator interface must be closest to the memory target interface. Whether or not a memory read request goes to off-chip memory is determined by the external memory configuration registers.

The output FIFO 214 contains result values waiting to be sent to the requester block. Each slot holds a value, a tag and a port identifier. if the table lookup engine received more than one concurrent batch of keys from different blocks, the results are intermingled in this FIFO 214. The results are sent to the correct clients in the order they enter the output FIFO 214, and it is up to the clients to use the tag to properly associate keys and values.

```
Lookup algorithm
    ValueType lookup(const lcsnode* trie, KeyType key)
    {
        // toplgwd is size of level 0 node
        int idx = key.topbits(toplgwd);
        key = key<<toplgwd;
        lcsnode nd = trie[idx]; // current entry
        while (nd.bcnt != 15) {
            unsigned int cksbits = key.topbits(nd.scnt);
            key = key<<nd.scnt;
            if (cksbits != nd.sbits) return missingValue;
            int nidx = key.topbits(nd.bcnt);
            key = key<<nd.bcnt;
            idx = nd.bindx+nidx;
            nd = trie[idx];
        }
        return concatenate(nd.scnt,nd.sbits,nd.bindx);
    }
```

The table lookup engine according to the embodiment of the present invention can achieve a peak performance of about 300 million lookups/second. This level of performance is based on the table lookup engine internal memory system being able to sustain a memory cycle rate of 800 million reads/second. This is achieved by using two banks of memory operating at 400 million reads/second with pipelining reads. The latency of the internal memory system needs to be of the order of 4-8 cycles. The number of state machines is chosen to saturate the memory interface. That is to say, there are enough state machines so that one of them is doing a memory access on nearly every cycle, for example 24 LSMs. Higher memory latencies can be tolerated by increasing the number of lookup state machines, but the practical limit is about 32 state machines.

The table lookup engine state machine lookup algorithm is fixed and fairly simple, to attain performance. The way that the table lookup engine achieves great flexibility in applications is in the software that constructs the LC-trie data structure. With this flexibility comes a cost, of course. It is expensive to generate the trie structure. The idea for using the table lookup engine is that some general purpose processor—for example in the control plane—preconstructs the trie data and places it in memory that is accessible by the bus, perhaps an external SRAM block. An onboard embedded processing unit is notified that a table update is ready and it does the actual update in the table lookup engine memory. The table lookup engine state machines consider the memory it uses to be big-endian. When constructing trie structures the correct type of endianness needs to be employed. In this way the table lookup engine can provide longest prefix matching. When constructing the trie from the routing table, overlapping ranges can be identified and split. This preprocessing step is not very expensive and does not significantly increase the trie size for typical routing tables. It also allows multiple concurrent tables to exist. This is achieved by prepending a small table identifier to the key. With eight tables, this would require three bits per key.

The table lookup engine according to the present invention can return the number of matching bits. The lookup engine returns whatever bits it finds in the last trie entry it fetched. Further, on a lookup failure that entry is uniquely determined by the lookup algorithm; it is the entry that would have contained the value had the missing key been present. The program that generates the trie structure could fill in all empty trie entries with the number of matching bits required to reach that trie entry. These return values could be flagged some way to distinguish them from lookup table hits by the generator program. Then the table lookup engine would return the number of matching bits on a lookup failure.

The table lookup engine according to the present invention also enables concurrent lookups and updates. One way to achieve this would be to have two versions of the table in table lookup engine memory simultaneously, and switch between them with a single write to a table lookup engine configuration register. Then lookups in progress will find either a value from the old version of the table or a value from the new version of the table. The embedded processing unit achieves this by first placing the new level 1-n nodes in the table lookup engine memory, then overwriting the level 0 node entry that points to the new nodes.

The table lookup engine according to the present invention also allows very large results to be produced. If a value for a given key needs to be more than 60 bits, an auxiliary table can be placed in the table lookup engine memory—actually any available memory—and an index into the auxiliary table placed in the table lookup engine value. The auxiliary table would then be read using normal memory indexing. This is purely a software solution, and has no implications to the table lookup engine internal operation.

Although a preferred embodiment of the method and apparatus of the present invention has been illustrated in the accompanying drawings and described in the forgoing detailed description, it will be understood that the invention is not limited to the embodiment disclosed, but is capable of numerous variations, modifications without departing from the scope of the invention as set out in the following claims.

The invention claimed is:

1. A method for performing a lookup in a hierarchy of nodes to obtain routing information for a packet, comprising:
   receiving an input key from a header in the packet;
   using a plurality of state machines comprising at least one processor and a plurality of memory banks to perform a plurality of lookups in parallel;
   using leading bits from the input key to index an entry in a first level of the hierarchy of nodes, wherein the entry contains either a value or a plurality of fields that specify:
      a skip-count indicating a number of bits to skip in the key,
      a skip-value to match against the skipped bits,
      a pointer to a next node in the hierarchy, and
      a number of index bits which are used to index the next node; and
   repeating the following operations until a value is returned or an error is indicated,
      when the entry includes a value, returning the value to provide the routing information for the packet, and
      when the entry includes a plurality of fields,
         skipping the next skip-count bits in the input key,
         comparing the skipped bits against the skip-value,
         when the skipped bits do not match the skip-value, indicating a lookup failure, and
         otherwise, using the next number of index bits from the input key and the pointer to index a next entry in the hierarchy of nodes.

2. The method of claim 1, wherein the hierarchy of nodes is organized as a level-compressed (LC) trie.

3. The method of claim 1, wherein using the plurality of state machines involves using a distributor block to distribute input keys to available state machines.

4. The method of claim 3, wherein the distributor block distributes the input keys from an input first-in-first-out (FIFO) buffer.

5. The method of claim 1, wherein after using the plurality of state machines, the method further comprises using a collector to collect outputs of the state machines, wherein the collector places the outputs in an output FIFO buffer.

6. The method of claim 1, wherein using the plurality of memory banks involves using a memory arbiter to arbitrate accesses to the plurality of memory banks.

7. The method of claim 1, wherein a length of the input key is fixed.

8. The method of claim 1, wherein a length of the input key is variable.

9. The method of claim 1, further comprising associating each input key with a tag to facilitate ordering output values in accordance with a received ordering of the input keys.

10. A lookup engine to perform a lookup in a hierarchy of nodes to obtain routing information for a packet, comprising:
    an input configured to receive an input key from a header in the packet;
    said lookup engine using a plurality of state machines comprising at least one processor and a plurality of memory banks to perform a plurality of lookups in parallel;
    a memory configured to store the hierarchy of nodes, wherein each node contains a plurality of entries, wherein a given entry contains either a value or a plurality of fields that specify,
       a skip-count indicating a number of bits to skip in the key,
       a skip-value to match against the skipped bits,
       a pointer to a next node in the hierarchy, and
       a number of index bits which are used to index the next node; and
    a lookup mechanism configured to use leading bits from the input key to index an entry in a first level of the hierarchy of nodes, and to repeat the following operations until a value is returned or an error is indicated,
       when the entry includes a value, return the value to provide the routing information for the packet, and
       when the entry includes a plurality of fields,
          skip the next skip-count bits in the input key,
          compare the skipped bits against the skip-value,
          when the skipped bits do not match the skip-value, indicate a lookup failure, and
          otherwise, use the next number of index bits from the input key and the pointer to index a next entry in the hierarchy of nodes.

11. The lookup engine of claim 10, wherein the hierarchy of nodes is organized as a level-compressed (LC) trie.

12. The lookup engine of claim 10, wherein using the plurality of state machines involves using a distributor block to distribute input keys to available state machines.

13. The lookup engine of claim 12, wherein the distributor block distributes the input keys from an input first-in-first-out (FIFO) buffer.

14. The lookup engine of claim 10, wherein after using the plurality of state machines, the method further comprises using a collector to collect outputs of the state machines, wherein the collector places the outputs in an output FIFO buffer.

15. The lookup engine of claim 10, wherein using the plurality of memory banks involves using a memory arbiter to arbitrate accesses to the plurality of memory banks.

16. The lookup engine of claim 10, wherein a length of the input key is fixed.

17. The lookup engine of claim 10, wherein a length of the input key is variable.

18. The lookup engine of claim 10, further comprising associating each input key with a tag to facilitate ordering output values in accordance with a received ordering of the input keys.

* * * * *